United States Patent
Zecri et al.

(10) Patent No.: US 7,170,135 B2
(45) Date of Patent: Jan. 30, 2007

(54) ARRANGEMENT AND METHOD FOR ESD PROTECTION

(75) Inventors: Michel Zecri, Colomiers (FR); Patrice Besse, Toulouse (FR); Nicolas Nolhier, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 332 days.

(21) Appl. No.: 10/651,128

(22) Filed: Aug. 28, 2003

(65) Prior Publication Data

US 2004/0104437 A1    Jun. 3, 2004

(30) Foreign Application Priority Data

Aug. 28, 2002 (EP) .................... 02292111

(51) Int. Cl.
 *H01L 23/60*    (2006.01)
(52) U.S. Cl. .................... 257/355; 257/173; 361/56
(58) Field of Classification Search ................ 257/173, 257/355; 361/56
See application file for complete search history.

(56) References Cited

U.S. PATENT DOCUMENTS

| | | | |
|---|---|---|---|
| 5,982,600 A * | 11/1999 | Cheng | .................... 361/111 |
| 2001/0007521 A1 | 7/2001 | Chen | |
| 2001/0033003 A1 | 10/2001 | Sawahata | |

FOREIGN PATENT DOCUMENTS

EP    1 162 664 A1    12/2001
EP    1162664 A1 *    12/2001

OTHER PUBLICATIONS

Delage et al., "The Mirrored Lateral SCR (MILSCR) as an ESD Protection Structure: Design and Optimization Using 2-D Device Simulation," *IEEE Journal of Solid-State Circuits*, Sep. 1999, vol. 34, No. 4, pp. 1283-1289.

Miller et al., "Engineering the Cascoded NMOS Output Buffer for Maximum $V_{11}$", *EOS/ESD Symposium Proceedings 2000*, Anaheim, CA, USA, Sep. 26-28, 2000. pp. 308-317.

* cited by examiner

*Primary Examiner*—George Eckert
*Assistant Examiner*—John Ingham
(74) *Attorney, Agent, or Firm*—Michael J. Balconi-Lamica (57) ABSTRACT

An arrangement (200) and method for scalable ESD protection of a semiconductor structure (140), a protection structure (120) providing a discharge transistor (110) path from an input/output node (130) to ground or another node if a threshold voltage is reached, wherein the discharge transistor is a self-triggered transistor having collector/drain (220) and emitter/source (210) regions, and a base/bulk region (260) having one or more floating regions (240) between the collector/drain (220) and emitter/source (210) regions. The floating region (N or P) modulates the threshold voltage Vtl for ESD protection. Vtl can be adjusted by shifting the floating region location. Splitting of the electric field into two parts reduces the maximum of the electric field. Vt1 can be adjusted volt-by-volt to suit application needs. ESD capability is increased by better current distribution in the silicon. This provides the advantages of reduced die size, faster time-to-market, less redesign cost, and better ESD performance.

22 Claims, 4 Drawing Sheets

FIG. 5

ARRANGEMENT AND METHOD FOR ESD PROTECTION

FIELD OF THE INVENTION

This invention relates to electrostatic discharge (ESD) protection, and particularly to scalable ESD protection for integrated circuits.

BACKGROUND OF THE INVENTION

The Electro-Static Discharge (ESD) problem is one of the first causes of redesign, after initial design and fabrication (e.g., 'first silicon'), for integrated circuits. A wide range of ESD solutions already exists but they are dedicated to protect only one kind of circuit. Hence, different ESD structures have to be developed for each application. In consequence, the ESD protection structures must be redefined and redeveloped for each technology and application.

Another point which has to be considered is the current absorption during the non-operating mode of the protection system.

An effective ESD protection has to be able to support ESD-HBM (Human Body Model minimum 2KV) and -MM (Machine Model minimum 200V) stresses with a minimum current consumption in normal operating mode. These protection structures also have to be able to support and to evacuate a minimum current of 1.33 A during ESD/HBM pulse. These structures must be efficient throughout the whole system lifetime.

It is known, for example from the publication by James W. Miller, Michael G. Khazhinsky and James C. Weldon titled "Engineering the cascoded NMOS output buffer for maximum Vt1" EOS-ESD, Symposium Proceeding 2000, to increase protection threshold voltage (Vt1) by replacing a single output buffer NMOSFET with 2 series or cascoded NMOSFETs. Such a Vt1 engineered output buffer offers advantage in ESD robustness, cost and process portability. However, Vt1 is sensitive to spacing between upper collector and lower emitter in MOS integrated circuit structure, and under the output NMOSFET lies a parasitic LNPN bipolar transistor. This LNPN transistor may turn on and undesirably provide an alternate ESD path.

From the publication by V. De Hey, G. Groeseneken, B. Keppens, M. Natarajan, Vacaresse and G Gallopyn titled "Design and analysis of new protection structures for smart Power Technology with controlled trigger and holding voltage", IEEE Physics symposium, Orlando, Fla., 2001, there is known an ESD protection structure based on bipolar transistors. The trigger and holding voltage can be adjusted. By adjusting the lateral base width, the bipolar conduction path (vertical or lateral) can be selected. The voltage range of this structure is not sufficient to cover all the product needs. Two bipolar transistors have to be controlled in order to have to the best distribution of constrained energy.

From patent publication EP 1 162 664 A1 there is known a low on-resistance lateral semiconductor device, such as a LDMOS (laterally diffused MOS transistor), comprising a drift region having a first surface and a first conductivity type, first and second semiconductor regions extending into the drift region from the first surface, and an additional region having a second conductivity type between the first and second semiconductor regions. The additional region extends into the drift region from the first surface and forms a junction dividing the electric field between the first and second semiconductor regions when a current path is established between the first and second semiconductor regions. This allows the doping concentration of the drift region to be increased, thereby lowering the on-resistance of the device. This device provides good distribution of the electric field, but ESD protection structures are not addressed (only lateral power MOS transistor are addressed in the publication).

However, existing ESD protection structures are based on different approaches to provide a scalable voltage in ESD structures. Bipolar transistors assembled in cascade are one of the solutions but these structures exhibit an important leakage current. For example, ESD protection structures are known based on the principal of Zener diodes located between gate and drain and between gate and source, the number of diodes allowing the snapback voltage level to be determined.

A physical study of the parasitic phenomenon in NMOS structure and their utilization as ESD protection in CMOS technology allows a better understanding of the parasitic operating mode (parasitic bipolar transistor) and their control, but control in such a study is most readily realized by addition of external passive elements like resistance between Gate/Source and capacitance between Drain/Gate. An important difficulty in implementing findings of such a study is in the choice of internal protection structures.

A need therefore exists for SPS (Scalable Protection Structures) wherein the abovementioned disadvantage(s) may be alleviated.

STATEMENT OF INVENTION

In accordance with a first aspect of the present invention there is provided a voltage protection arrangement as claimed in claim 1.

In accordance with a second aspect of the present invention there is provided a method of voltage protection as claimed in claim 11.

BRIEF DESCRIPTION OF THE DRAWINGS

Two SPS (Scalable Protection Structures) incorporating the present invention will now be described, by way of example only, with reference to the accompanying drawings, in which.

DESCRIPTION OF PREFERRED EMBODIMENT(S)

The Electro-Static Discharge (ESD) problem is one of the first causes of redesign for integrated circuits after 'first silicon'. A wide range of solutions is already existing but they are each dedicated to protect only one kind of circuit. Hence, different ESD structures have to be developed for each application. In consequence, the ESD protection structures must be redefined and redeveloped for each technology and application.

Another point which has to be considered is the current absorption during the non-operating mode of the protection system.

As will be described in greater detail below, the present invention allows an ESD protection structure permitting a scalable level of voltage protection (scalable Vt1) without changing the number of external components and may be based on NMOS of PMOS devices and may require only one different photloythographic mask to introduce additional n+ and/or p+ apertures in a DRIFT area.

Such a structure could be used to protect a large voltage spectrum by changing the structure geometry only. The ESD operating mode of such a simulated structure submitted to minimum 2 kV of ESD discharge is a 'snapback' phenomenon for a low ESD current level. The protected voltage diffusions and biased diffusions and of the number and location of the n+ and/or p+ diffused rings between the biased diffusions.

The NMOS and/or PMOS devices may be used indiscriminately in all applications where ESD protection is necessary. The invention allows an active clamp when the device is submitted to an ESD stress. This active clamp is linearly tunable and strongly dependent of the device geometry.

Bipolar parasitic effects, which are inherent in NMOS and/or PMOS structures, may be used in the present invention. The gate of such structures does not influence significantly their behavior; also, these structures are usable without gate.

Such a new ESD protection structure is also interesting because it allows a low leakage current in normal operating mode. In addition, an important aspect may be a low derivative current after snapback due to the low dynamic resistance of such devices.

Figure 1:
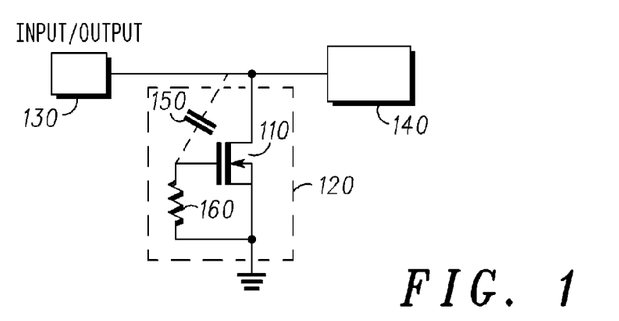
FIG. 1 shows a schematic circuit diagram of an integrated circuit ESD protection structure utilising the present invention.

Referring now to FIG. 1, one of the ESD protection structure 120 configurations for an ESD protection strategy is shown. The ESD protection structure 120 (between an input/output pad 130 and a device or devices 140) could be connected differently depending on the strategy of ESD protection. Associated with ESD protection structure 120 are self-triggering transistor 110, capacitance 150 and resistance 160.

Figure 2A:
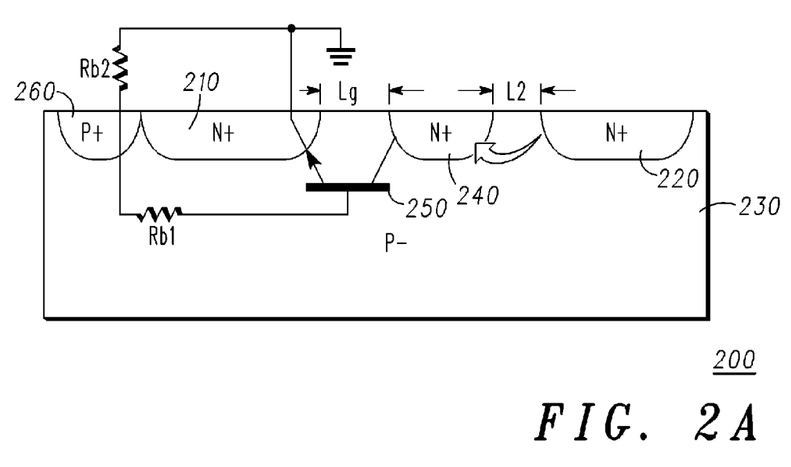
FIGS. 2A and 2B show part-circuit-schematic, part-cross-sectional diagrams of first and second configurations respectively of a semiconductor structure implementing the ESD protection as shown in FIG. 1.
Figure 2B:
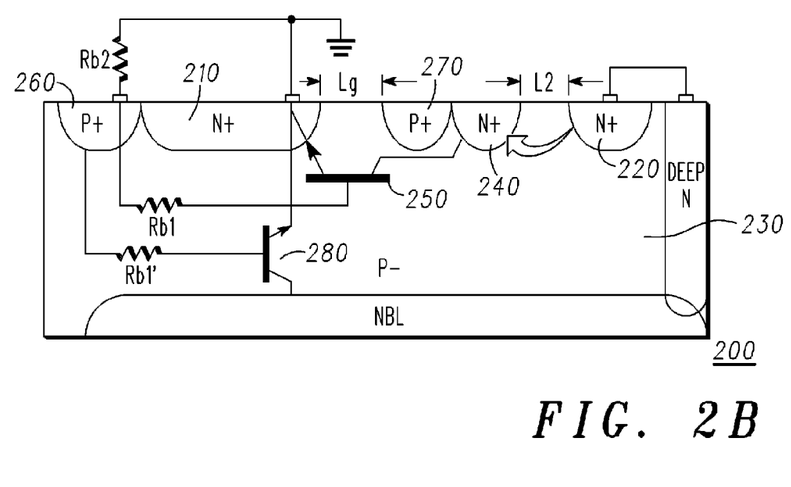

Referring now also to FIGS. 2A & 2B, for a better understanding of the ESD behavior of these structures, regarding the bipolare effects, the electrodes names will be "collector" for the "drain" contact and respectively "emitter" for the source contact and "base" for the "body" contact.

In an integrated circuit implementation 200, the emitter and collector of the self-triggering transistor 110 are formed by highly doped N+ regions 210 and 220 and a highly doped P+ (base) 260 on a P− doped region 230. As will be explained in greater detail below, an additional heavily doped N+ floating region 240 is located between the emitter and collector regions 210 and 220. The internal resistance Rb1 allows triggering of the bipolar transistor effect of the bipolar transistor 250 formed by the emitter region 210, P− region 230 and the floating region 240. The Rb1 value could be controlled by the N+ emitter length. Addition of the external resistance Rb2, or the increasing of the N+ source region, allows desired values of these resistances to be obtained. The L2 length between the floating region 240 and the collector region 220 (which controls electrical field device capability) defines the voltage capability of the ESD structure. The Lg length, distance between the N+ emitter diffusion (210) and N+ floating island (240) permits to adjust the bipolar transistor gain.

Referring to FIG. 2B, a P+ diffusion 270 is added close to the N+ floating island 240 in order to obtain a low threshold voltage protection structure. Moreover, an alternative configuration, using deep N and NBL (N doped buried layer) regions connected to the collector 220, is used in order to achieve high ESD capability of the considered protection structure. In this later case, a vertical bipolar transistor 280 is triggered, as allowed by internal resistance Rb1', to assure the current path. The N+ floating diffusion 240, mainly allows adjusting the threshold voltage value, Vt1. the current path. The N+ floating difusion 240, mainly allow adjusting the threshold voltage value, Vt1.

The behavior of this protection structure is based on the high doped floating island 240 introduced between the emitter region 210 and the collector region 220, wherein the doping can be chosen similar to that of the emitter and collector.

The technical behaviour of this embodiment of the invention is described below. It will be understood that alternatively to the embodiment described above which uses NMOS devices with a N+ floating island on P− body region, this invention could be used on PMOS structures with a N− body region and a P+ floating island.

Figure 3A:
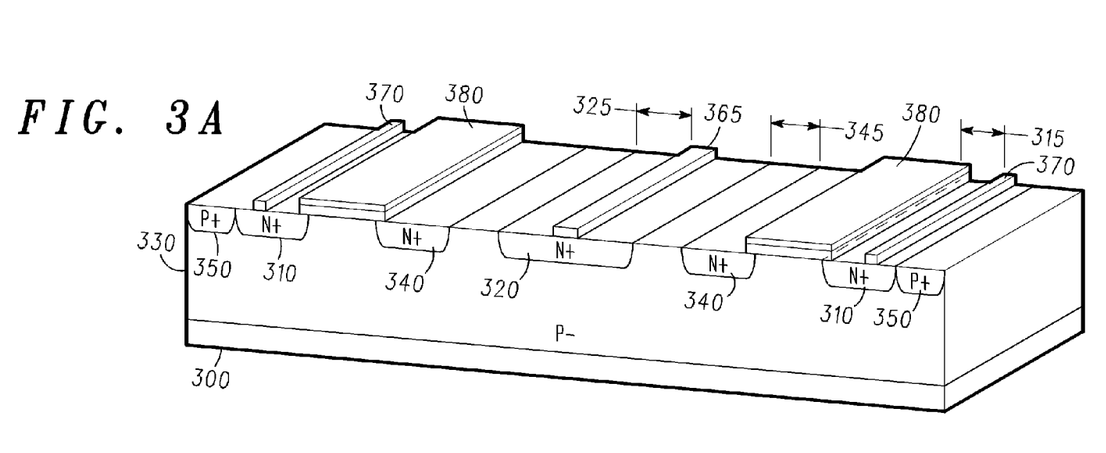
FIGS. 3A and 3B show part-cross-sectional, part-elevational views of first and second configurations respectively of a semiconductor device incorporating the semiconductor structure of FIGS. 2A and 2B respectively.
Figure 3B:
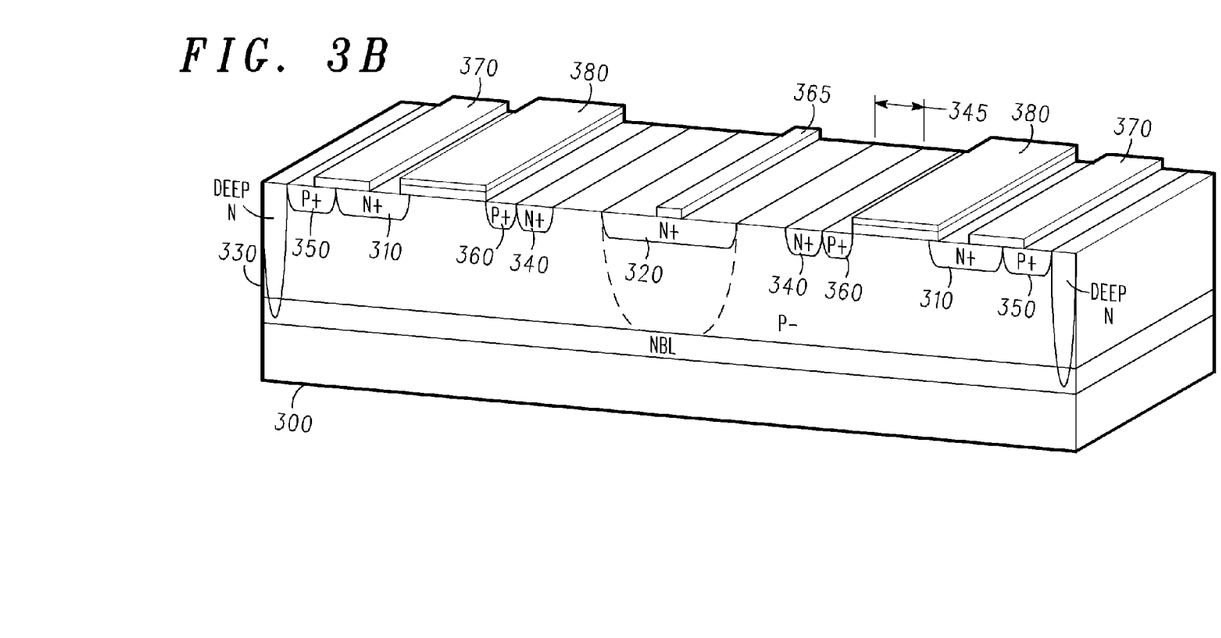

In this embodiment, the elementary cell (FIGS. 2A, 2B) can be mirrored along P+ diffusion 260 and/or N+ collector diffusion 220. The ESD capability of these structures can be scaled adjusting the device area. In order to obtain a compact structure, the elementary cell can be duplicated and added in parallel. An example of such a layout is shown in FIGS. 3A & 3B, in which two highly doped NSD finger emitter regions 310 are provided on opposite sides of a highly doped N+ finger region 320, and between each of the emitter regions 310 and the collector region 320 is a respective floating N+ finger region 340. The N+ and P+ finger regions are provided in an epitaxial layer 330 on a substrate 300. Furthermore, the layout includes P+ diffusion 350 on the P-doped epitaxial layer 330 (similar to the P+ diffusion 260 of FIGS. 2A and 2B). Still further, the layout illustrates contact 365, contacts 370, and gate 380 of the device structure. Contact 370 is spaced from an edge of the N+ emitter diffusion 310 by a distance (or width) 315. Similarly, contact 365 is spaced from an edge of the N+ collector diffusion 320 by a distance (or width) 325. Referring to FIG. 3B, the Deep N and the NBL configuration is used with or without an additional floating P+ island 360. Moreover, the opportunity to connect the NBL region with a Deep N under the collector 320 is offered.

It will be appreciated that, in the above-described ESD protection structures, there are four different possibilities to scale the voltage clamp level:

firstly, by adjusting the "L2" length (designated 345 in FIG. 3) in order to scale the voltage capability of this region;

secondly, by increasing "L2" length and putting on the "L2" area a higher number of floating rings or islands;

thirdly, by the floating region 340 associated to an opposite high doped diffusion 360 in order to provide a lower voltage clamp; and Fourthly, by changing the floating island characteristics (geometry and/or doping).

Figure 4A:
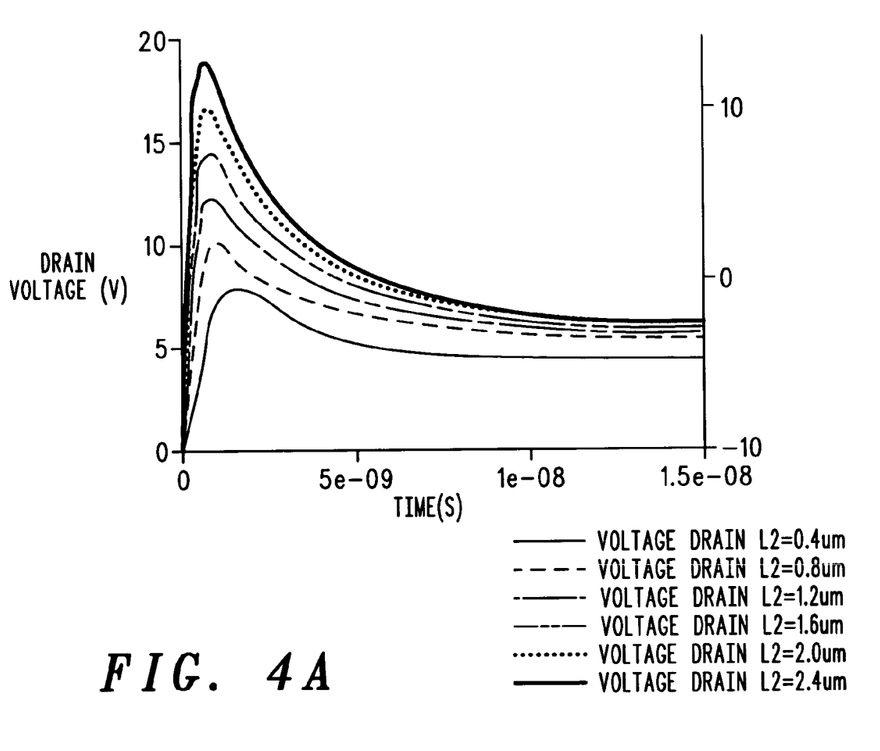
FIG. 4A and FIG. 4B show graphs illustrating ESD performance of the semiconductor device/structure of FIGS. 1, 2A & 2B and 3A & 3B.
Figure 4B:
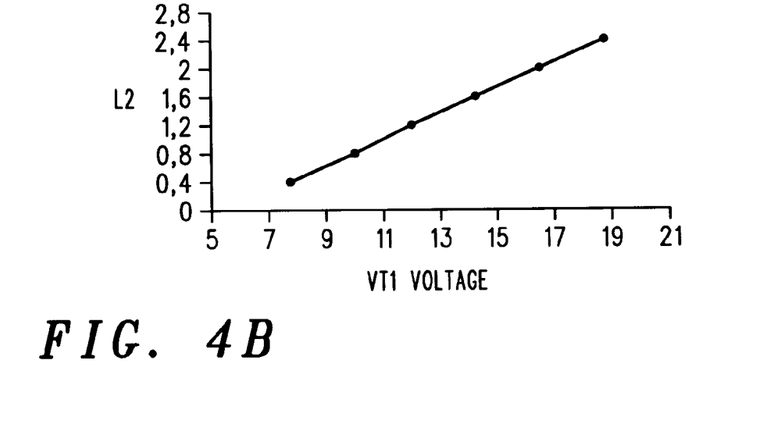

It will be appreciated that all these different "L2" length variations allow a quasi linearly scalable voltage level, as depicted in the graphs of FIG. 4, in which FIG. 4A shows the voltage drain during ESD pulse as a function of time for different values of L2, and in which FIG. 4B shows the protection threshold voltage VT1 as a function of L2.

Figure 5:
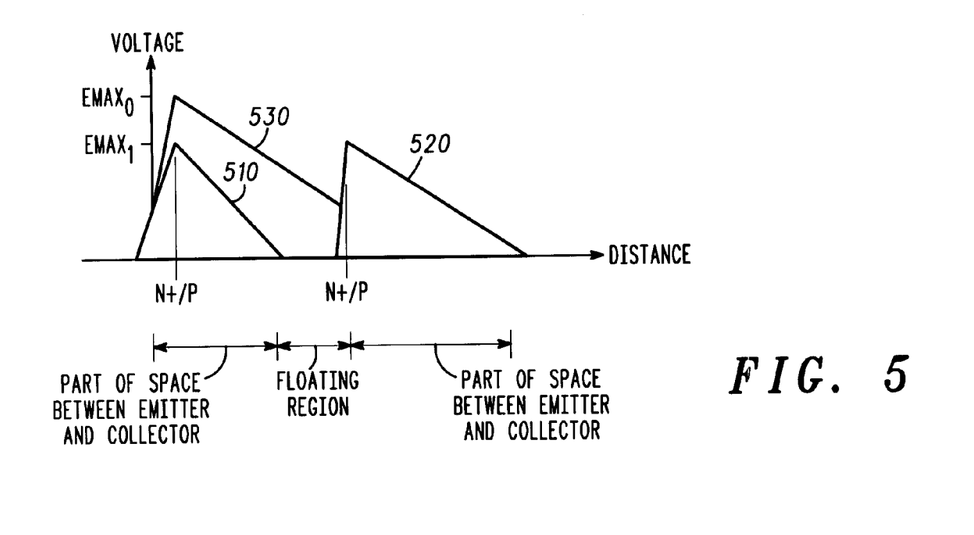
FIG. 5 shows how electric field between collector and emitter is separated in two parts by a floating diffusion in the drift area in the semiconductor device/structure of FIGS. 1, 2 and 3.

It will be understood that the SPS (Scalable Protection Structure) described above provides the following advantages. This ESD protection structure operates according to two different physical effects:

(i) The area between the FLOATING region and the collector region controls the voltage threshold, Vt1, of this protection structure; this voltage is strongly dependent on the doping of the region 330 and on length of the region 345. As shown in FIG. 5, the electric field distribution between the collector & emitter is separated in two parts (510 and 520) by the floating region (240, 340) in the drift area. This separation results in the maximum electrical field (Emax$_1$) in each of these separated parts being lower than the maximum voltage (Emax$_0$) that would occur between emitter and collector (this voltage profile being shown by dotted-line 530) if the FLOATING region (240, 270, 340, 360) were not present.

(ii) The floating region creates a parasitic bipolar transistor with the emitter region and the contact 370 as a transistor base, which realizes the snapback function of this ESD protection structure.

Figure 6:
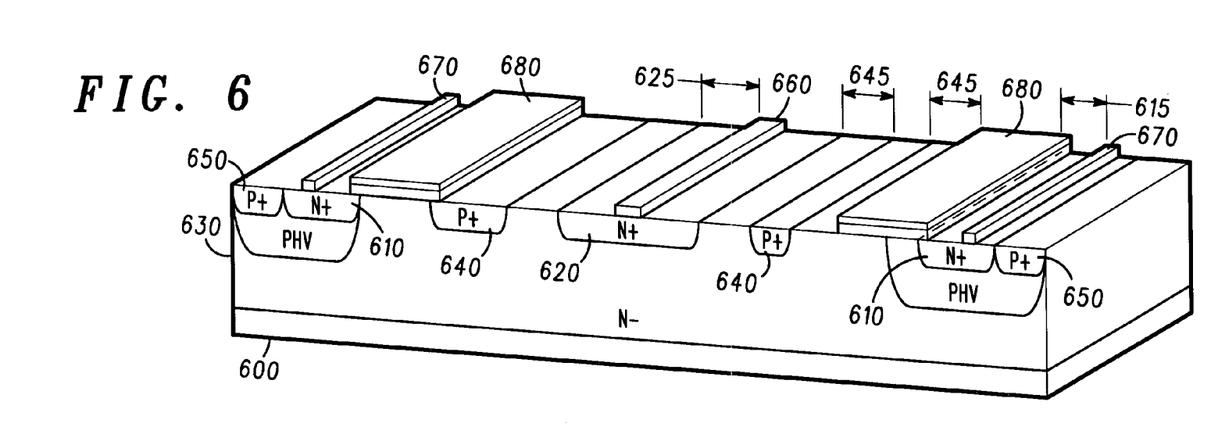
FIG. 6 shows a part-cross-sectional, part-elevational view of an alternative semiconductor device, similar to that of FIGS. 3A & 3B.

It will be understood that the present invention could be extended to high voltage protection structures if the nature of the floating region is opposed to the nature of the collector and emitter regions, as shown in FIG. 6.

As seen in FIG. 6, the high voltage protection structure could be used on a structure with an epitaxial layer 630 and floating regions 640 and a body diffusion (PHV). Similarly to FIGS. 3A & 3B, in the semiconductor device of FIG. 6 two highly doped N+ finger emitter regions 610 are provided on opposite sides of a highly doped N+ finger collector region 620, and between each of the emitter regions 610 and the collector region 620 is a respective floating N+ finger region 640. The N+ and P+ finger regions are provided in the epitaxial layer 630 on a substrate 600. The embodiment of FIG. 6 also includes P+ diffusions 650 within a corresponding PHV diffusion as shown. Further similarly to FIGS. 3A and 3B, the structure of FIG. 6 includes contact 660, contacts 670, and gates 680. Contact 670 is spaced from an edge of N+ emitter diffusion 610 by a distance (or width) 615. Similarly, contact 660 is spaced from an edge of N+ collector diffusion 620 by a distance (or width) 625. The dimension 645 is representative of a length L2, similar to that as indicated in FIGS. 3A and 3B by reference numeral 345.

This structure can also be used with PNP (NMOS) devices with a N+ region and a P− epitaxy region.

A remarkable point in these structures is the fact that during the ESD discharge the current path is deep in the silicon due to the floating island. The behavior of the high voltage protection structure is thus quite different than prior art proposals.

In conclusion it will be appreciated that the ESD protection structures described above in relation to FIGS. 1–6 allow the ESD protection voltage to be adjusted to a threshold voltage to suit the application requirements. The scalable method with floating diffusion is portable from technology to technology.

In summary, the main advantages of the ESD protection structures described above in relation to FIGS. 1–6 are the electrical field distribution and the separation of the two physical phenomena, namely the voltage threshold and the bipolar effect.

These advantages allow:

Reduced die size,

Faster progress from 'first silicon' to market,

Less redesign cost, and

Better ESD performance.

The invention claimed is:

1. A voltage protection arrangement for use to protect a semiconductor structure from electro-static discharge voltage at an input node thereof, the arrangement comprising:
   discharge means, having an input for coupling to the input node, and an output for coupling to ground, the discharge means being arranged to provide a discharge path from the input node to ground if the voltage at the input node exceeds a threshold voltage,
   wherein the discharge means comprises self-triggered transistor means having one of:
      collector and emitter regions if said self-triggered transistor means comprises bipolar transistor means, and
      drain and source regions if said self-triggered transistor means comprises MOS transistor means, and
   at least one floating region therein ranged to modify a threshold voltage by separating an electric field between one of:
      the collector and emitter regions when the self-triggered transistor means comprises bipolar transistor means, and
      the drain and source regions when the self-triggered transistor means comprises MOS transistor means.

2. The voltage protection arrangement of claim 1 wherein one of:
   when the self-triggered transistor means comprises bipolar transistor means, the bipolar transistor means has a grounded base, and
   when the self-triggered transistor means comprises MOS transistor means, the MOS transistor means has a grounded gate.

3. The voltage protection arrangement of claim 1 wherein, when the self-triggered transistor means comprises MOS transistor means, the MOS transistor means is arranged to exhibit a resistance between its gate and source.

4. The voltage protection arrangement of claim 2, comprising at least one electric field region between the at least one floating region and one of:
   the emitter region when the self-triggered transistor means comprises bipolar transistor means, and
   the source region when the self-triggered transistor means comprises MOS transistor means,
wherein the length of the at least one electric field region determines the threshold voltage.

5. The voltage protection arrangement of claim 2, wherein the at least one floating region is arranged to form, with one of:
   the emitter region when the self-triggered transistor means comprises bipolar transistor means, and
   the source region when the self-triggered transistor means comprises MOS transistor means
and adjacent semiconductor material, a bipolar transistor.

6. The voltage protection arrangement of claim 1, wherein the at least one floating region comprises a plurality of floating regions.

7. The voltage protection arrangement of claim 6, wherein the plurality of floating regions are arranged between alternating:
   collector and emitter regions when the self-triggered transistor means comprises bipolar transistor means, and
   drain and source regions when the self-triggered transistor means comprises MOS transistor means.

8. The voltage protection arrangement of claim 7, wherein the self-triggered transistor means comprises one of:
   PNP transistor means when said self-triggered transistor means comprises bipolar transistor means, and
   PMOS transistor means when said self-triggered transistor means comprises MOS transistor means,
   the at least one floating region comprises P+ type material and the arrangement is provided in N− type material.

9. The voltage protection arrangement of claim 1, wherein the self-triggered transistor means comprises one of:
   NPN transistor means when said self-triggered transistor means comprises bipolar transistor means, and
   NMOS transistor means when said self-triggered transistor means comprises MOS transistor means,
   the at least one floating region comprises N+ type material and the arrangement is provided in P− type material.

10. The voltage protection arrangement of claim 1, wherein the self-triggered transistor means comprises LDMOS transistor means when said self-triggered transistor means comprises MOS transistor means.

11. A semiconductor device comprising the voltage protection arrangement of claim 1.

12. A method of voltage protection for use to protect a semiconductor structure from electro-static discharge voltage at an input node thereof, the method comprising:
   providing discharge means, having an input coupled to the input node, and an output coupled to ground, the discharge means providing a discharge path from the input node to ground if the voltage at the input node exceeds a threshold voltage,
   wherein the discharge means comprises self-triggered transistor means having one of:
      collector and emitter regions if said self-triggered transistor means comprises bipolar transistor means, and
      drain and source regions if said self-triggered transistor means comprises MOS transistor means, and
   at least one floating region therein arranged to modify a threshold voltage by separating an electric field between one of:
      the collector and emitter regions when the self-triggered transistor means comprises bipolar transistor means, and
      the drain and source regions when the self-triggered transistor means comprises MOS transistor means.

13. The method of voltage protection of claim 12 wherein one of:
   when the self-triggered transistor means comprises bipolar transistor means, the bipolar transistor means has a grounded base, and
   when the self-triggered transistor means comprises MOS transistor means, the MOS transistor means has a grounded gate.

14. The method of voltage protection of claim 12 wherein, when the self-triggered transistor means comprises MOS transistor means, the MOS transistor means is arranged to exhibit a resistance between its gate and source.

15. The method of voltage protection of claim 13, further comprising providing at least one electric field region between the at least one floating region and one of:
   the emitter region when the self-triggered transistor means comprises bipolar transistor means, and
   the source region when the self-triggered transistor means comprises MOS transistor means,
wherein the length of the at least one electric field region determines the threshold voltage.

16. The method of voltage protection of claim 13, wherein the at least one floating region forms, with one of:
   the emitter region when the self-triggered transistor means comprises bipolar transistor means, and
   the source region when the self-triggered transistor means comprises MOS transistor means
and adjacent semiconductor material, a bipolar transistor.

17. The method of voltage protection of claim 12, wherein the at least one floating region comprises a plurality of floating regions.

18. The method of voltage protection of claim 17, wherein the plurality of floating regions are provided between alternating:
   collector and emitter regions when the self-triggered transistor means comprises bipolar transistor means, and
   drain and source regions when the self-triggered transistor means comprises bipolar transistor means.

19. The method of voltage protection of claim 12, wherein the self-triggered transistor means comprises one of:
   PNP transistor means when said said self-triggered transistor means comprises bipolar transistor means, and
   PMOS transistor means when said self-triggered transistor means comprises MOS transistor means, the at least one floating region comprises P+ type material and the arrangement is provided in N− type material.

20. The method of voltage protection of claims 12, wherein the self-triggered transistor means comprises one of:
   NPN transistor means when said said self-triggered transistor means comprises bipolar transistor means, and
   NMOS transistor means when said self-triggered transistor means comprises MOS transistor means, the at least one floating region comprises N+ type material and the arrangement is provided in P− type material.

21. The method of voltage protection of claim 12, wherein the self-triggered transistor means comprises LDMOS transistor means when said self-triggered transistor means comprises MOS transistor means.

22. The method of voltage protection of claim 12, performed in a semiconductor device.

* * * * *

UNITED STATES PATENT AND TRADEMARK OFFICE
CERTIFICATE OF CORRECTION

PATENT NO. : 7,170,135 B2 Page 1 of 1
APPLICATION NO. : 10/651128
DATED : August 28, 2003
INVENTOR(S) : Michel Zecri

It is certified that error appears in the above-identified patent and that said Letters Patent is hereby corrected as shown below:

In Column 6, Line 29, Claim No. 1:

Change "at least one floating region therein ranged" to --at least one floating region therein arranged--

Signed and Sealed this

Tenth Day of June, 2008

JON W. DUDAS
*Director of the United States Patent and Trademark Office*

UNITED STATES PATENT AND TRADEMARK OFFICE
CERTIFICATE OF CORRECTION

PATENT NO. : 7,170,135 B2  Page 1 of 1
APPLICATION NO. : 10/651128
DATED : January 30, 2007
INVENTOR(S) : Michel Zecri It is certified that error appears in the above-identified patent and that said Letters Patent is hereby corrected as shown below:

In Column 6, Line 29, Claim No. 1:

Change "at least one floating region therein ranged" to --at least one floating region therein arranged--

This certificate supersedes the Certificate of Correction issued June 10, 2008.

Signed and Sealed this

Fifteenth Day of July, 2008

JON W. DUDAS
*Director of the United States Patent and Trademark Office*